United States Patent
Enami et al.

(10) Patent No.: US 9,025,334 B2
(45) Date of Patent: May 5, 2015

(54) STRUCTURE FOR FIXING ELECTRIC PART FOR MOTOR-DRIVEN COMPRESSOR

(75) Inventors: Shingo Enami, Aichi-ken (JP); Yusuke Kinoshita, Aichi-ken (JP); Masanori Tsuzuki, Aichi-ken (JP)

(73) Assignee: Kabushiki Kaisha Toyota Jidoshokki, Aichi-ken (JP)

( * ) Notice: Subject to any disclaimer, the term of this patent is extended or adjusted under 35 U.S.C. 154(b) by 344 days.

(21) Appl. No.: 13/551,825

(22) Filed: Jul. 18, 2012

(65) Prior Publication Data

US 2013/0021753 A1 Jan. 24, 2013

(30) Foreign Application Priority Data

Jul. 19, 2011 (JP) ................. 2011-157841

(51) Int. Cl.
*H05K 7/20* (2006.01)
*H05K 7/14* (2006.01)
*H05K 3/30* (2006.01)
*H01L 23/40* (2006.01)

(52) U.S. Cl.
CPC .............. *H05K 7/1432* (2013.01); *H05K 3/306* (2013.01); *H05K 7/2049* (2013.01); *H01L 23/4006* (2013.01); *H05K 2201/10424* (2013.01); *H05K 2201/10166* (2013.01); *H01L 2023/4081* (2013.01); *H01L 2023/4087* (2013.01); *H01L 2924/0002* (2013.01)

(58) Field of Classification Search
CPC .......... H05K 7/20; H05K 7/12; H05K 7/2049
See application file for complete search history.

(56) References Cited

U.S. PATENT DOCUMENTS

| | | | |
|---|---|---|---|
| 5,801,330 A | 9/1998 | Gademann et al. | |
| 6,552,912 B1* | 4/2003 | Kanazawa et al. | 361/752 |
| 7,187,553 B2* | 3/2007 | Schmidberger | 361/719 |
| 7,206,204 B2 | 4/2007 | Nakatsu et al. | |
| 7,643,297 B2 | 1/2010 | Tominaga et al. | |
| 8,053,888 B2* | 11/2011 | Mlotkowski | 257/718 |
| 8,130,499 B2 | 3/2012 | Ohnishi et al. | |
| 8,764,415 B2* | 7/2014 | Hattori et al. | 417/410.1 |
| 2005/0128713 A1* | 6/2005 | Schmidberger | 361/719 |
| 2005/0135065 A1 | 6/2005 | Nakatsu et al. | |
| 2006/0139857 A1 | 6/2006 | Tsuji | |
| 2008/0205107 A1 | 8/2008 | Hattori et al. | |
| 2009/0213550 A1* | 8/2009 | Hongo | 361/704 |
| 2010/0079958 A1 | 4/2010 | Kaehs et al. | |
| 2010/0091464 A1 | 4/2010 | Ohnishi et al. | |

FOREIGN PATENT DOCUMENTS

CN  1630076 A   6/2005
DE  196 04 124 A1  8/1996

(Continued)

OTHER PUBLICATIONS

Extended European Search Report for corresponding EP Patent Application No. 12175242.2 issued on Nov. 23, 2012.

(Continued)

*Primary Examiner* — Gregory Thompson
(74) *Attorney, Agent, or Firm* — Sughrue Mion, PLLC

(57) ABSTRACT

An electric part fixing structure for a motor-driven compressor includes an electric part having a plurality of leads and a guide member for positioning the leads. The guide member is made of a plastic and has a guide hole through which the lead is passed.

10 Claims, 5 Drawing Sheets

(56) References Cited

FOREIGN PATENT DOCUMENTS

| | | |
|---|---|---|
| EP | 1 544 915 A2 | 6/2005 |
| EP | 1 965 624 A2 | 9/2008 |
| EP | 2 120 263 A1 | 11/2009 |
| JM | 2005-183644 A | 7/2005 |
| JP | 2002198477 A | 7/2002 |
| JP | 2002-319780 A | 10/2002 |
| JP | 2003-007941 A | 1/2003 |
| JP | 2003-031979 A | 1/2003 |
| JP | 2003347783 A | 12/2003 |
| JP | 2008-184947 A | 8/2008 |
| JP | 2008-215089 A | 9/2008 |
| WO | 2009069308 A1 | 6/2009 |

OTHER PUBLICATIONS

Communication dated Jul. 22, 2014, from the State Intellectual Property Office of the People's Republic of China in counterpart Chinese Application No. 201210248189.7.

* cited by examiner

STRUCTURE FOR FIXING ELECTRIC PART FOR MOTOR-DRIVEN COMPRESSOR

BACKGROUND OF THE INVENTION

The present invention relates to a structure for fixing an electric part for a motor-driven compressor.

Japanese Patent Application Publication 2008-184947 discloses a motor-driven compressor which includes a compression mechanism for compressing and discharging refrigerant gas, an electric motor for driving the compression mechanism and a drive circuit for controlling and driving the electric motor. In such motor-driven compressor, the drive circuit has an electric part such as a switching element that is generally fixed by a screw to a cooling member serving also as a support member. In such a fixing structure, after the electric part is fixed to the cooling member, a substrate is mounted to the electric part from above. In mounting the substrate to the electric part, a lead of the electric part need to be passed upward through a hole formed in the substrate.

In the electric part fixing structure of the above Publication, the work for mounting the substrate is troublesome and leaves much to be improved. Particularly, the size of the hole of the substrate is limited, so that it is difficult to pass many leads through their corresponding holes.

The present invention which has been made to solve the above-identified problem is directed to providing an electric part fixing structure that allows a workman to mount a substrate to a motor-driven compressor easily.

SUMMARY OF THE INVENTION

An electric part fixing structure for a motor-driven compressor includes an electric part having a plurality of leads and a guide member for positioning the leads. The guide member is made of a plastic and has a guide hole through which the lead is passed.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

DETAILED DESCRIPTION OF THE PREFERRED EMBODIMENTS

Figure 1:
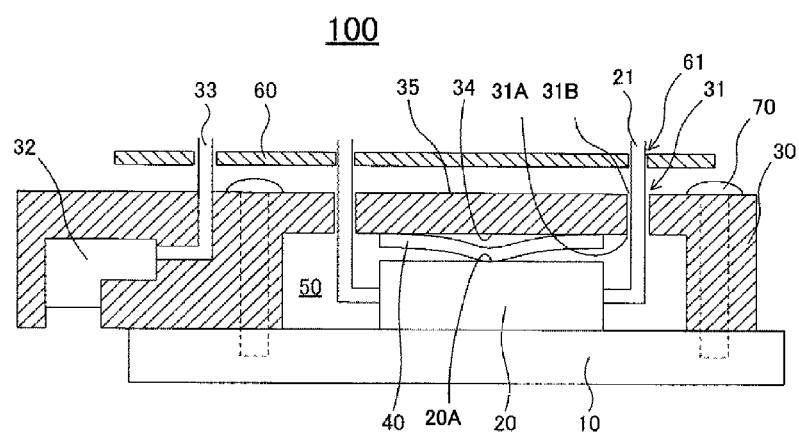
FIG. 1 is a cross-sectional view of an electric part fixing structure according to a first embodiment of the present invention.
Figure 2:
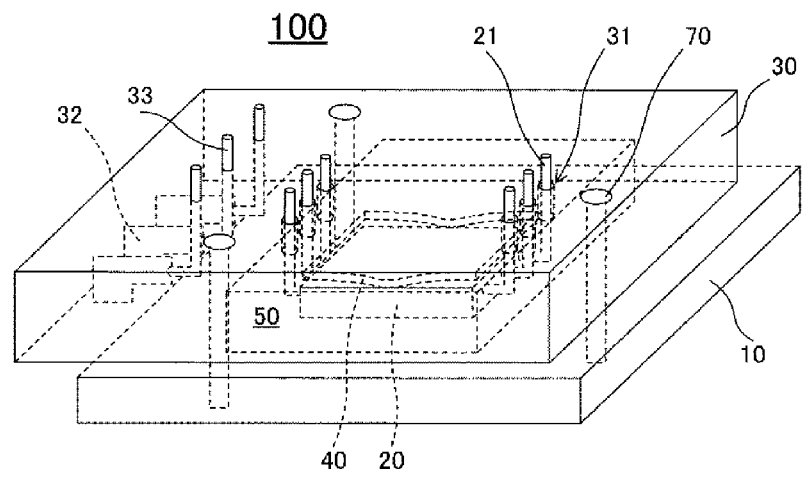
FIG. 2 is a schematic perspective view of the electric part fixing structure of FIG. 1.

Referring to FIGS. 1 and 2, the electric part fixing structure for a motor-driven compressor according to the first embodiment is generally designated by numeral 100. In FIG. 2, for the sake of convenience, a substrate designated by numeral 60 in FIG. 1 is omitted from the illustration and output terminals designated by numeral 32 in FIG. 1 are drawn in a simplified shape but actually have a shape of a known female terminal. The output terminals 32 are connected to an electric motor (not shown) of the motor-driven compressor.

The electric part fixing structure 100 according to the first embodiment fixes an electric part used, e.g., for a drive circuit of the motor-driven compressor. The electric part fixing structure 100 includes a cooling member 10 and an IGBT (Insulated Gate Bipolar Transistor) 20 that serves as the electric part of the present invention, is fixed to the cooling member 10 and has a plurality of leads 21. The cooling member 10 that is made of, e.g., an aluminum alloy has a relatively high thermal conductivity and radiates heat generated by the IGBT 20 in operation. The cooling member 10 functions as a support member for the IGBT 20.

The electric part having a plurality of leads is not limited to an IGBT but may be a switching element such as a MOSFET (Metal-Oxide Semiconductor Field-Effect Transistor) or an IPM (Intelligent Power Module) including a switching element. The electric part may also be a capacitor or a coil.

The electric part fixing structure 100 further includes a guide member 30 for positioning the leads 21 of the IGBT 20. The guide member 30 is made of a plastic and has formed therein on the side thereof facing the IGBT 20 a recess. The guide member 30 is fixed to the cooling member 10 by screws 70 as a fixing member. The IGBT 20 is disposed in the recess of the guide member 30. The cooling member 10 and the guide member 30 cooperate to form an electric part accommodation space 50 housing the entire IGBT 20. The guide member 30 has an inner surface 34 forming a part of the electric part accommodation space 50 and facing the IGBT 20 and an outer surface 35 that is the opposite surface of the guide member 30 from the inner surface 34. The IGBT 20 is disposed in the electric part accommodation space 50 between the guide member 30 and the cooling member 10.

The guide member 30 has formed therethrough a plurality of guide holes 31 each extending between the inner surface 34 and the outer surface 35 of the guide member 30 and having an inner opening 31A of the inner surface 34 and an outer opening 31B of the outer surface 35. The inner opening 31A faces the IGBT 20. The guide hole 31 allows the lead 21 to pass therethrough. Thus, the leads 21 are positioned by the guide holes 31.

Figure 3A:
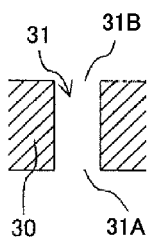
FIGS. 3A, 3B and 3C are schematic cross-sectional views of guide holes of the electric part fixing structure according to the first embodiment, a second embodiment and an alternative embodiment derived from the second embodiment, respectively.

In the first embodiment, the guide hole 31 is formed in the shape of a right circular cylinder in axial direction thereof as shown in FIG. 3A, so that the inner opening 31A and the outer opening 31B are circular in shape and have the same diameter and hence the same area.

The output terminal 32 is fixed to the guide member 30 and has a lead 33. The output terminal 32 is connected to the electric motor (not shown) of the motor-driven compressor by any suitable wiring (not shown) and provided for each of U, V, W-phases of the electric motor. The guide member 30 also serves as a fixing member for fixing the output terminals 32 of the respective phases and forms a part of an output terminal structure including the output terminals 32 for the respective phases. In other words, a plastic member that forms a part of the output terminal structure is modified into the guide member 30 by being enlarged or extended so as to cover the IGBT 20.

The lead 33 of the output terminal 32 is fixed to the guide member 30 during molding of the guide member 30. Therefore, no guide hole is formed preliminarily in the guide member 30 for the lead 33 of the output terminal 32.

A leaf spring 40 as the elastic member of the present invention is provided between the guide member 30 and the IGBT 20. The guide member 30 urges the IGBT 20 against the cooling member 10 through the leaf spring 40. In the first embodiment, the IGBT 20 is not screwed to the cooling member 10 and no member is used for fixing the IGBT 20 directly to the cooling member 10. Instead, the IGBT 20 is urged against the cooling member 10 by the leaf spring 40, with the result that the IGBT 20 is held firmly or fixed to both of the cooling member 10 and the guide member 30.

The position or the area where the leaf spring 40 is in contact with the IGBT 20 can be changed anywhere as long as the leaf spring 40 can urge the IGBT 20 properly against the cooling member 10. The IGBT 20 can be secured firmly when the leaf spring 40 is in contact with the IGBT 20 at the position 20A of the gravity center of the IGBT 20 or at an area including the position 20A. The position 20A of the gravity center of the IGBT 20 is located on a line that extends through the gravity center of the IGBT 20 and also parallel to the direction in which the leaf spring 40 urges the IGBT 20.

The electric part fixing structure 100 further includes a substrate 60. The substrate 60 includes a circuit (not shown) and has formed therethrough a plurality of lead holes 61 through which leads are passed for connection to the circuit. Particularly, the leads 21 of the IGBT 20 or the leads 33 of the output terminals 32 are passed through the lead holes 61 that may be formed in the shape of a right circular cylinder as in the case of the guide holes 31 of the guide member 30. Though not shown in FIG. 1, the lead 21 is fixed to the substrate 60 by soldering inside or around the lead hole 61.

The guide holes 31 are provided at positions corresponding to the respective lead holes 61 of the substrate 60. As shown FIG. 1, two guide holes 31 are formed coaxially with their corresponding lead holes 61. However, the guide hole 31 needs not be precisely coaxial with its corresponding lead hole 61, but the guide hole 31 and the lead hole 61 may be formed only to such an accuracy that the interior of the electric part accommodation space 50 is visible from outside (or from above the substrate 60 in FIG. 1) through the guide hole 31 and the lead hole 61. In other words, the guide hole 31 and the lead hole 61 may be formed so that a straight line passes through the guide hole 31 and the lead hole 61.

As apparent from FIGS. 1 and 2, each guide hole 31 and its corresponding lead hole 61 have the same lead 21 passed therethrough.

The diameter (or the opening area) of the inner opening 31A of the guide hole 31 is larger than that of the lead hole 61. Therefore, the work for passing the lead 21 of the IGBT 20 through the guide member 30 according to the first embodiment is easier than that for passing a lead such as 21 of the IGBT directly through a substrate such as 60 according to the prior art. Additionally, according to the first embodiment, the lead 21 passed through the guide hole 31 is positioned by the guide hole 31, so that passing the lead 21 through the substrate 60 can be facilitated and, therefore, the assembling the electric part fixing structure 100 can be performed with reduced cost and increased efficiency.

Furthermore, the IGBT 20 is fixed by the leaf spring 40 without using any screws. Thus, the electric part fixing structure 100 according to the first embodiment can dispense with screws for fixing the IGBT 20. In the prior art, a total of four screws including two screws for fixing the output terminal 32 and two screws for fixing the IGBT 20 is required. In the first embodiment shown in FIG. 2, however, only three screws are used for fixing the guide members 30, so that the number of screws and the manufacturing cost can be reduced while maintaining the strength of the electric part fixing structure 100.

Additionally, the IGBT 20 that is fixed by the leaf spring 40 is pressed against the cooling member 10 more uniformly and hence cooled more efficiently than in the case that the IGBT 20 is fixed by using screws. Generally, a screw hole can not be formed in the center of an IGBT, so that no pressure can be applied directly to the center of the IGBT in fixing the IGBT by a screw. According to the first embodiment, however, the pressure can be applied to the gravity center or its vicinity directly for efficient cooling of the IGBT 20.

In accordance with an increase of the cooling effect, the motor-driven compressor can be operated in a wider load range as compared with a case where the IGBT is fixed by screws. The desired cooling effect can be maintained under a low voltage and a high current, so that the motor-driven compressor can be operated in a wider voltage range, resulting in a reduction of future cost.

As described above, the guide member 30 forms a part of the output terminal structure. The guide member 30 serves to fix the output terminal 32 and the IGBT 20, so that the output terminal 32 and the IGBT 20 can be disposed close to each other, with the result that the inductance therebetween can be reduced.

Additionally, the leaf spring 40 that is made of a metal can maintain the urging force for fixing the IGBT 20 under a high temperature. If any plastic fixing member is used for fixing the IGBT 20, the strength of the plastic fixing member in contact with the IGBT 20 is reduced with an increase of the IGBT temperature (or creep phenomenon occurs), with the result that the IGBT 20 may be displaced due to the vibration of the device. In the electric part fixing structure 100 according to the first embodiment, however, the use of the leaf spring 40 that is made of a metal can prevent the displacement of the IGBT 20.

Figure 3B:
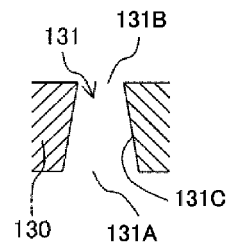
Figure 3C:
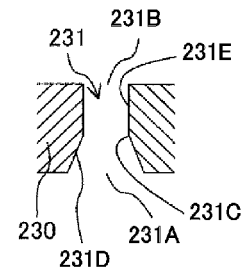

Referring to FIGS. 3B and 3C showing the second embodiment of the present invention, the electric part fixing structure is designated by numeral 300 and differs from the first embodiment in the shape of the guide hole. FIG. 3B and FIG. 3C show the cross-sectional views of the guide holes according to the second embodiment and the alternative embodiment derived from the second embodiment, respectively. The guide holes are designated by numeral 131, 231 and formed in the guide members 130, 230, respectively. Each shape of the guide holes 131, 231 is different from that of the guide hole 31 according to the first embodiment as shown in FIG. 3A.

As shown in FIG. 3B, the guide hole 131 is formed to have a slant surface 131C that is formed in such a way that the diameter of the guide hole 131 decreases gradually from the inner opening 131A to the outer opening 131B. In other words, the area of the inner opening 131A is larger than that of the outer opening 131B and the cross sectional area of the guide hole 131 is reduced gradually from the inner opening 131A to the outer opening 131B.

Such structure wherein the diameter of the guide hole 131 at the inner opening 131A is increased allows the lead 21 of the IGBT 20 to pass through the guide hole 131 of the guide member 130 with increased ease. Meanwhile, the diameter of the guide hole 131 at the outer opening 131B can be reduced, so that the lead 21 can be positioned more precisely and, therefore, passing the lead 21 through the substrate 60 can be facilitated further.

Referring to FIG. 3C, the inner surface of the guide hole 231 includes a slant surface 231D that is formed on the inner opening 231A side of the guide hole 231 and a cylindrical surface 231E that is formed on the outer opening 231B side of the guide hole 231. The slant surface 231D is formed in the range from the inner opening 231A to a position of transition 231C and the cylindrical surface 231E is formed from the position of transition 231C to the outer opening 231B. The diameter (or the area) of the inner opening 231A is larger than that of the outer opening 231B.

As in the case of the guide hole 131 shown in FIG. 3B, the guide hole 231 according to the alternative embodiment can be formed in such a way that the inner opening 231A of the guide hole 231 is made larger and the outer opening 231B thereof is made smaller, so that passing the lead 21 through the guide member 230 and the substrate 60 can be facilitated.

Figure 4:
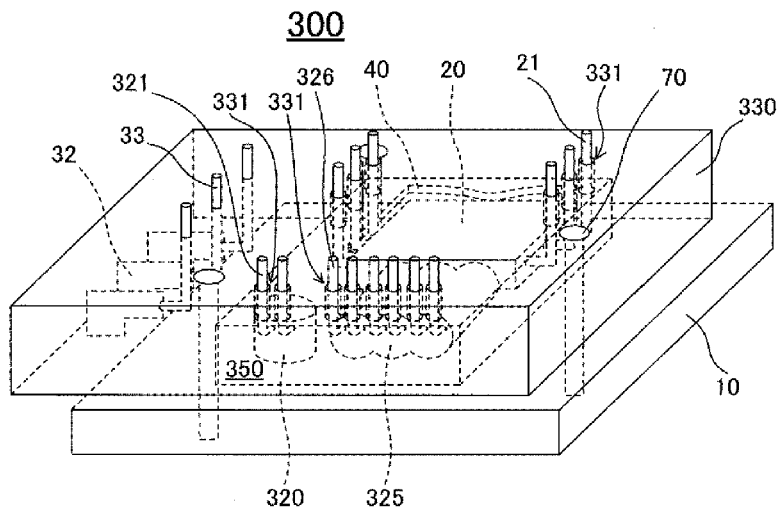
FIG. 4 is a schematic perspective view of the electric part fixing structure according to a third embodiment.
Figure 5:
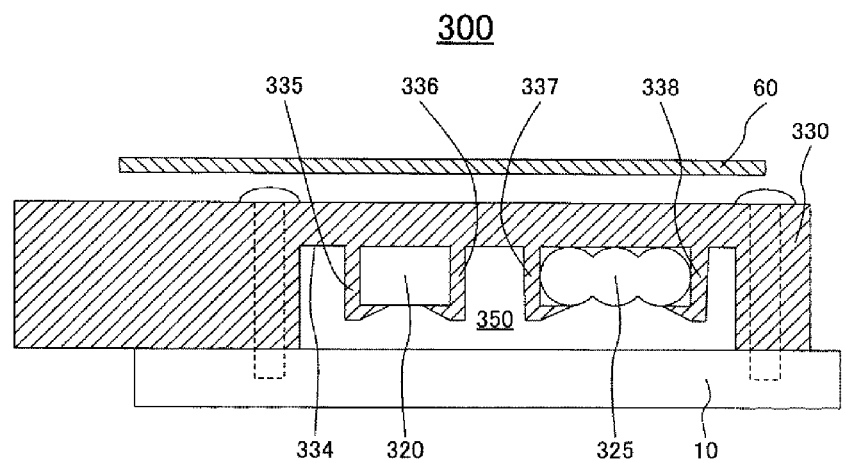
FIG. 5 is a cross-sectional view of the electric part fixing structure of FIG. 4 wherein a capacitor and a coil are fixed in a space formed in electric part of the electric part fixing structure.

Referring to FIGS. 4 and 5 showing the third embodiment of the present invention, the electric part fixing structure designated by numeral 300 differs from the first embodiment in that the electric part fixing structure 300 includes fixing members and attachments for holding a plurality of other electric parts in addition to the IGBT 20. The electric part accommodation space designated by numeral 350 corresponds to the electric part accommodation space 50 according to the first embodiment. For the sake of convenience, the substrate 60 and attachments 335 through 338 which are show in FIG. 5 are omitted in FIG. 4. In the third embodiment, other electric parts such as a capacitor 320 and a coil 325 in addition to the IGBT 20 are housed in the electric part accommodation space 350. As in the case of the first embodiment, the IGBT 20 is fixed by the leaf spring 40.

Referring to FIG. 5 showing the electric part fixing structure 300 in fragmentary sectional view, the capacitor 320 and the coil 325 are fixed in the electric part accommodation space 350 of the electric part fixing structure 300. Numeral 330 designates a guide member that corresponds to the counterpart 30 of the first embodiment. The guide member 330 includes two pairs of attachments 335, 336 and 337, 338 for fixing the electric parts to the guide member 330. As shown in FIG. 5, the attachments 335, 336 cooperate to form a capacitor holder for fixing the capacitor 320 and the attachments 337, 338 cooperate to form a coil holder for fixing the coil 325.

Figure 6:
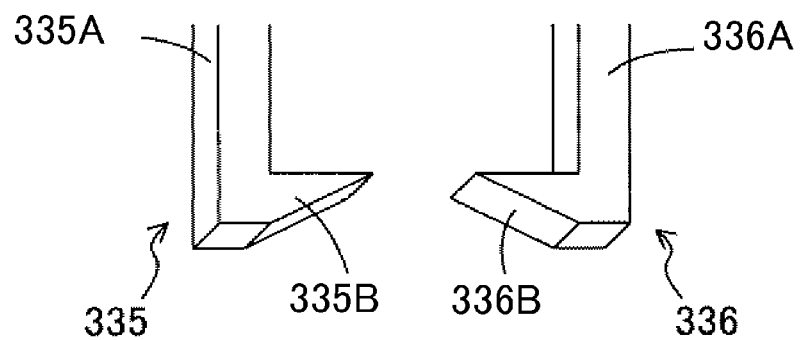
FIG. 6 is a schematic partially enlarged perspective view of a pair of attachments of the electric part fixing structure of FIG. 5.

FIG. 6 shows the capacitor holding attachments 335, 336 in perspective view. The two attachments 337, 338 for holding the coil 325 have a similar shape as the attachments 335, 336 and, therefore, the following description will focus on the former attachments 335, 336. The attachment 335 includes a support portion 335A extending from the inner surface 334 of the guide member 330 into the electric part accommodation space 350 (or toward the cooling member 10) and a hook portion 335B extending from the lower end of the support portion 335A toward a paired hook portion 336B of the other attachment 336. Similarly, the other attachment 336 includes a support portion 336A and the hook portion 336B.

As indicated above, the attachments 335, 336 and 337, 338 fix the capacitor 320 and the coil 325, respectively. Particularly, the support portion 335A of the attachment 335 restrains the capacitor 320 from moving horizontally (or in the direction parallel to the inner surface 334) and apart from the attachment 336. Similarly, the other support portion 336A of the attachment 336 restrains the capacitor 320 from moving horizontally and apart from the attachment 335. The hook portions 335B, 336B restrain the capacitor 320 from moving vertically (or in the direction perpendicular to the inner surface 334) and hold the capacitor 320 between the inner surface 334 and the hook portions 335B, 336B. As is the case with the attachments 335, 336, the attachments 337, 338 restrain the coil 325 from moving.

The capacitor 320 has leads 321 and the coil 325 has leads 326. Like the lead 21 of the IGBT 20 in the first embodiment (shown in FIG. 1), the leads 321 of the capacitor 320 and leads 326 of the coil 325 are passed through the guide holes 331 of the guide member 330 and also through lead connection holes (not shown) of the substrate 60 for connection to the substrate 60.

Such structure of the third embodiment allows a plurality of electric parts to be fixed by the single guide member 330, thereby further facilitating passing of the various leads through the substrate 60. Meanwhile, in a fixing structure where a plurality of electric parts are fixed by fixing members such as screws individually, the respective electric parts tend to be displaced, so that the relative positions among the electric parts fail to be determined and, therefore, passing the leads through their corresponding lead connection holes of the substrate is troublesome. However, in the electric part fixing structure 300 according to the third embodiment, a plurality of electric parts may be fixed at the desired positions by the guide member 330 having formed therethrough the guide holes 331, so that the leads of the electric parts can be positioned precisely and, therefore, passing the leads through their corresponding lead connection holes of the substrate can be facilitated further.

The electric part fixing structure 300 according to the third embodiment can be modified as follows. In the third embodiment, the IGBT 20 may be fixed by any attachments in the same manner as the capacitor 320 is fixed by the attachments 335, 336. Alternatively, the capacitor 320 and the coil 325 may be fixed by a leaf spring. Furthermore, the electric part may be fixed by a combination of the leaf spring and the attachments.

In the third embodiment, each electric part is fixed by a pair of attachments, but may be fixed by more than two attachments. For example, three attachments may be disposed so as to surround one electric part from three different directions for holding the part.

Figure 7:
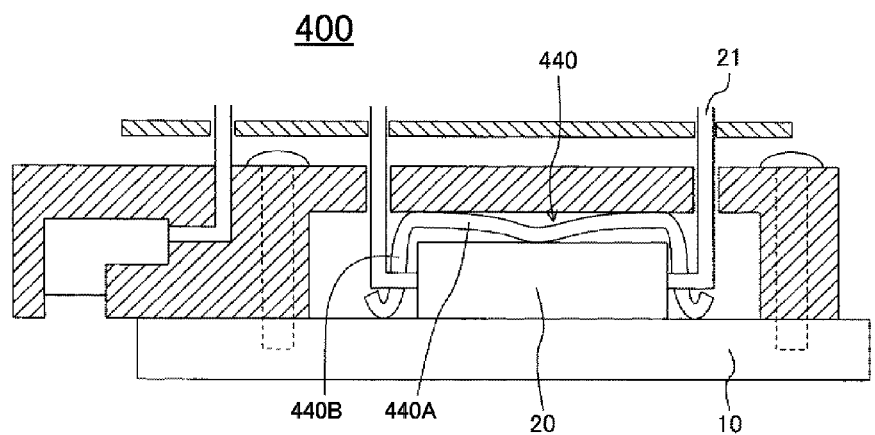
FIG. 7 is a cross-sectional view of an electric part fixing structure according to a fourth embodiment of the present invention.

Referring to FIG. 7 showing the fourth embodiment of the present invention, the electric part fixing structure is designated by numeral 400 and differs from the first embodiment in the shape of the leaf spring 440.

In FIG. 7, numeral 440 designates an elastic member of the electric part fixing structure 400 that includes a leaf spring portion 440A and a cooling portion 440B formed integrally with the leaf spring portion 440A. The leaf spring portion 440A has substantially the same structure as the leaf spring 40 of the first embodiment (shown in FIG. 1) and urges the IGBT 20 against the cooling member 10. The cooling portion 440B is formed by outer peripheral portion of the elastic member 440 and extends to the cooling member 10 in contact therewith. As long as the cooling portion 440B is in no contact with the lead 21, the cooling portion 440B may have any shape. For example, the cooling portion 440B may be formed in the shape of a leg, as shown in FIG. 7, with a predetermined width.

As is the case with the first embodiment, a part of the heat generated by the IGBT 20 is transferred from the IGBT 20 to the cooling member 10 directly. The rest of the heat is transferred through the leaf spring portion 440A and the cooling portion 440B to the cooling member 10. Therefore, the heat generated by the IGBT 20 can be released through a plurality of channels, so that the IGBT 20 can be cooled efficiently.

Figure 8:
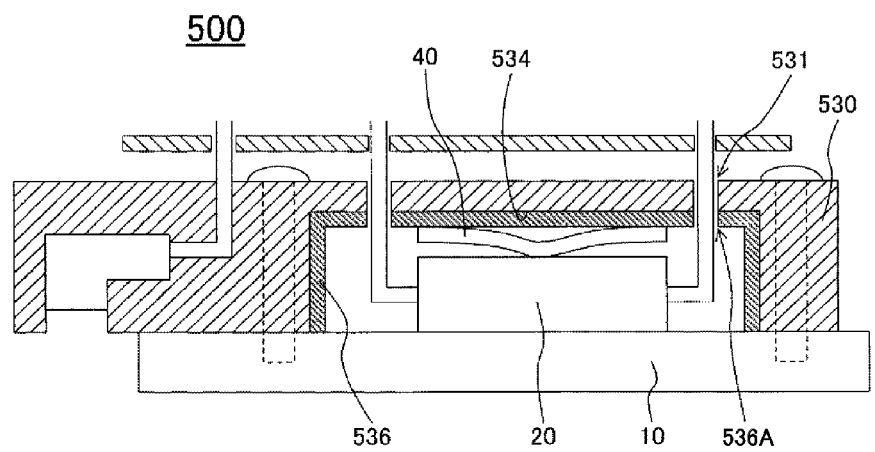
FIG. 8 is a cross-sectional view of an electric part fixing structure according to a fifth embodiment of the present invention.

Referring to FIG. 8 showing the fifth embodiment of the present invention, the electric part fixing structure designated by numeral 500 differs from the first embodiment in that a radiator is provided on the inner surface of the guide member.

The radiator 536 is provided in the form of a layer on the inner surface 534 of the guide member designated by numeral 530. The radiator 536 may be made of a metal and may be fixed to the guide member 530 by any suitable adhesive. However, the radiator 536 is not necessarily fixed to the guide member 530 as long as the radiator 536 is disposed in contact with the guide member 530. The radiator 536 is also in contact with the leaf spring 40 and the cooling member 10. Holes 536A are formed through the radiator 536 at positions corresponding to the respective guide holes 531 in the guide member 530. Although the radiator 536 is disposed so as to cover the entire inner surface 534, as shown in FIG. 8, the radiator does not necessarily cover the entire inner surface 534, but may have any shape as long as the radiator 536 is disposed in contact with both of the leaf spring 40 and the cooling member 10.

Such structure according to the fifth embodiment allows a part of the heat generated by the IGBT 20 to be transferred directly to the cooling member 10 as is the case with the first embodiment and the rest of the heat to be transferred to the cooling member 10 through the leaf spring 40 and the radiator 536. Therefore, the heat of the IGBT 20 can be released through a plurality of channels, so that the IGBT 20 can be cooled efficiently.

Figure 9:
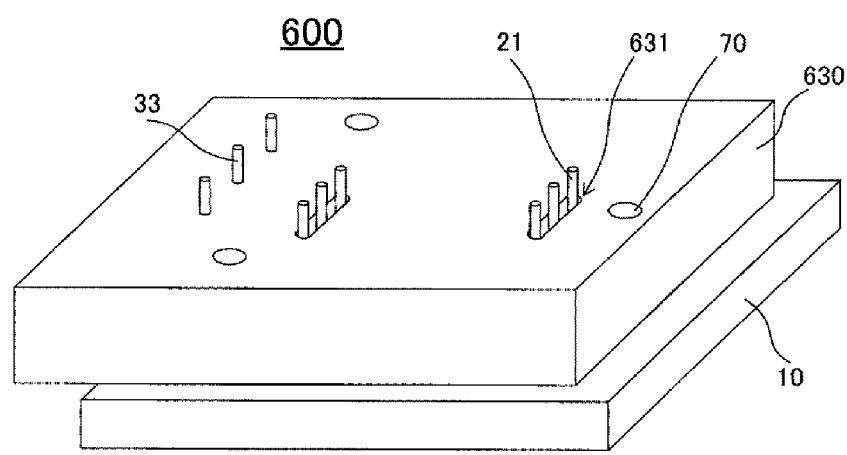
FIG. 9 is a schematic perspective view of an electric part fixing structure according to a sixth embodiment of the present invention.

Referring to FIG. 9 showing the sixth embodiment of the present invention, the electric part fixing structure designated by numeral 600 differs from the first embodiment in that the guide hole 631 is modified over the guide hole 31 of the first embodiment. For the sake of convenience, the detailed illustrations drawn by the broken lines in FIG. 2 are omitted in FIG. 9.

As shown in FIG. 9, the guide member of the sixth embodiment designated by numeral 630 corresponds to the counterpart 30 of the first embodiment and has formed therethrough two guide holes 631 having the shape of an elongated hole, having the same size and extending parallel to each other on the surface of the guide member 630. The guide hole 631 is not limited to the above elongated shape, but may have any shape as long as the guide hole 631 can perform the function of positioning the lead 21 properly. A plurality of leads 21, three leads 21 in the illustrated embodiment, are passed through the guide hole 631. The leads 21 are thus positioned by the guide holes 631. As compared with the first embodiment, a plurality of leads 21 can be passed collectively through the guide hole 631, so that passing of the leads 21 through the guide member 630 can be facilitated further. Additionally, reduction in the number of the guide hole helps to simplify the manufacturing of the guide member 630.

Figure 10:
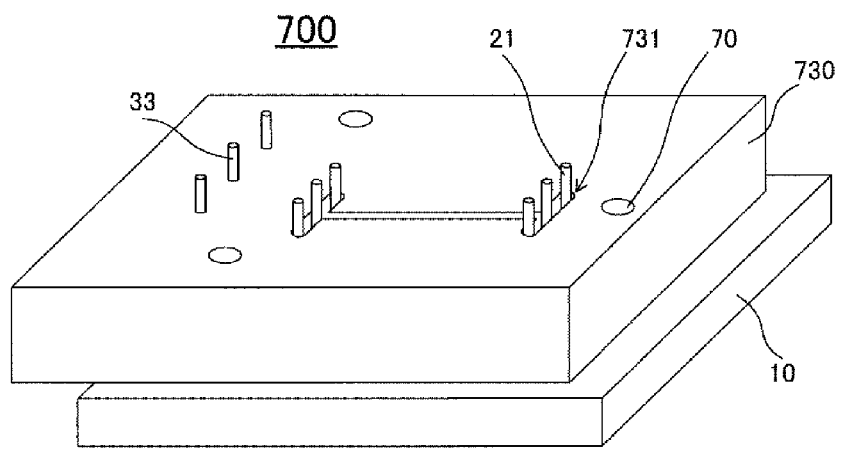
FIG. 10 is a schematic perspective view of an electric part fixing structure according to a seventh embodiment of the present invention.

Referring to FIG. 10 showing the seventh embodiment of the present invention, the electric part fixing structure designated by numeral 700 differs from the first embodiment in that the structure of the guide hole of the sixth embodiment is modified further.

The guide member designated by numeral 730 corresponds to the counterpart 30 of the first embodiment and has formed therethrough a single guide hole 731 through which all the leads 21 are passed. As shown in FIG. 10, the guide hole 731 is formed in an H-shape in that two parallel holes are connected at the centers thereof by a third hole extending perpendicularly to the two parallel holes. The guide hole 731 is not limited to the above shape, but may have any shape as long as the guide hole 731 can perform the function of positioning the lead 21 properly. The leads 21 are thus positioned by the guide hole 731. As compared with the first embodiment, all the leads 21 can be passed collectively through one guide hole 731, so that passing of the leads 21 through the guide member 730 can be facilitated much further. Additionally, reduction in the number of the guide hole 731 helps to simplify the manufacturing of the guide member 730.

Any part of the electric part fixing structure in the above embodiments 1 through 7 may be combined. For example, the electric part fixing structure includes a combination of a guide member having a guide hole whose inner surface forms a slant surface as in the second embodiment and a guide member that fixes a plurality of electric parts in addition to the IGBT as in the third embodiment. Another example of the electric part fixing structure may include a combination of a guide member that fixes a plurality of electric parts as in the third embodiment, a leaf spring such as 40 of the first embodiment for fixing some of the electrical parts and an elastic member such as 440 of the fourth embodiment for fixing the rest of the electrical parts.

In the electric part fixing structure having a guide member that fixes a plurality of electric parts as in the third embodiment (shown in FIG. 4), two guide holes may be provided for the IGBT 20 as in the case of the sixth embodiment (shown in FIG. 6) and one guide hole may be provided for each of the capacitor 320 and the coil 325. Additionally, all the leads for the IGBT 20, the capacitor 320 and the coil 325 may be passed through a single guide hole such as 731 in the seventh embodiment.

In the above-described embodiments 1 through 7, the guide member and the cooling member do not necessarily cooperate to cover the electric part entirely. For example, in the first embodiment, the electric part accommodation space 50 may have an additional opening that is larger than the guide hole 31.

What is claimed is:

1. An electric part fixing structure for a motor-driven compressor comprising:
   an electric part having a plurality of leads; and
   a guide member for positioning the leads, wherein the guide member is made of a plastic and has a guide hole through which one of the leads is passed, and
   a cooling member radiating heat generated by the electric part, wherein the electric part is disposed between the guide member and the cooling member and the guide member is fixed to the cooling member,
   the electric part fixing structure further comprises an elastic member disposed between the guide member and the electric part, wherein the guide member urges the electric part against the cooling member through the elastic member, wherein the elastic member is positioned in between the leads of the electric member and maintains an urging force for fixing the electric part to the cooling member.

2. The electric part fixing structure for the motor-driven compressor according to claim 1, wherein the guide hole includes an inner opening facing the electric part and an outer opening, wherein the area of the inner opening is larger than that of the outer opening.

3. The electric part fixing structure for the motor-driven compressor according to claim 2, wherein the guide hole further includes a slant surface that is formed in the guide hole.

4. The electric part fixing structure for the motor-driven compressor according to claim 1, further comprising:
   a substrate including a circuit and a lead hole through which one of the leads is passed, wherein the lead hole is formed coaxially with the guide hole.

5. The electric part fixing structure for the motor-driven compressor according to of claim 1, wherein the electric part is entirely housed by the guide member and the cooling member.

6. The electric part fixing structure for the motor-driven compressor according to claim 1, wherein the elastic member is a leaf spring.

7. The electric part fixing structure for the motor-driven compressor according to claim 1, wherein the elastic member is in contact with the cooling member.

8. The electric part fixing structure for the motor-driven compressor according to claim 1, wherein the guide member further includes an attachment which fixes the electric part to the guide member for preventing the electric part from moving.

9. The electric part fixing structure for the motor-driven compressor according to claim 1, wherein the electric part fixing structure further comprises an output terminal fixed to the guide member.

10. The electric part fixing structure for the motor-driven compressor according to any one of claims 1-4, 5, and 6-9, wherein the electric part includes at least one of an IGBT, a capacitor and a coil.

\* \* \* \* \*